United States Patent
Driemeyer-Franco et al.

(10) Patent No.: US 10,436,849 B2
(45) Date of Patent: Oct. 8, 2019

(54) SYSTEM AND CORRESPONDING METHOD FOR ESTIMATING THE CHARGE STATUS OF A BATTERY

(71) Applicant: RENAULT s.a.s., Boulogne-Billancourt (FR)

(72) Inventors: Ana-Lucia Driemeyer-Franco, Montigny-le-Bretonneux (FR); Marc Lucea, Boulogne-Billancourt (FR); Antoine Saint-Marcoux, Palaiseau (FR); Anh-Linh Bui-Van, Saint Nizier du Moucherotte (FR); Pierre Perichon, Voiron (FR)

(73) Assignee: RENAULT s.a.s., Boulogne-Billancourt (FR)

( * ) Notice: Subject to any disclaimer, the term of this patent is extended or adjusted under 35 U.S.C. 154(b) by 925 days.

(21) Appl. No.: 14/401,406

(22) PCT Filed: May 15, 2013

(86) PCT No.: PCT/FR2013/051055
§ 371 (c)(1),
(2) Date: Nov. 14, 2014

(87) PCT Pub. No.: WO2013/171425
PCT Pub. Date: Nov. 21, 2013

(65) Prior Publication Data
US 2015/0100259 A1    Apr. 9, 2015

(30) Foreign Application Priority Data
May 15, 2012 (FR) .................................... 12 54426

(51) Int. Cl.
*G01R 31/3842*   (2019.01)
*G01R 31/396*    (2019.01)
(Continued)

(52) U.S. Cl.
CPC ..... *G01R 31/3842* (2019.01); *G01R 31/3648* (2013.01); *G01R 31/396* (2019.01);
(Continued)

(58) Field of Classification Search
CPC .................................................. H01M 10/425
(Continued)

(56) References Cited

U.S. PATENT DOCUMENTS 5,744,931 A * 4/1998 Arai ................... G01R 31/3631
                                                        320/106
6,380,716 B1 * 4/2002 Finger ................ G01R 31/3648
                                                        320/130
(Continued)

OTHER PUBLICATIONS

International Search Report dated Jul. 3, 2013 in PCT/FR2013/051055.
(Continued)

*Primary Examiner* — Michael J Dalbo
(74) *Attorney, Agent, or Firm* — Oblon, McClelland, Maier & Neustadt, L.L.P.

(57) ABSTRACT

A system and method estimates the state of charge of a battery comprising at least two modules each provided with at least one cell. A sensor senses a series current flowing through all cells of the modules connected in series. A switching device selectively disconnects one of the modules, the other modules remaining connected in series. A calculator calculates the state of charge of the cells through which the series current flows from the integration of the series current and calculates the state of charge of each of the cells of the disconnected module from an open circuit voltage thereof.

10 Claims, 3 Drawing Sheets

(51) Int. Cl.
  *G01R 31/36* (2019.01)
  *H01M 10/44* (2006.01)
  *H01M 10/48* (2006.01)
  *G01R 31/3828* (2019.01)

(52) U.S. Cl.
  CPC .......... *G01R 31/36* (2013.01); *G01R 31/3828* (2019.01); *H01M 10/441* (2013.01); *H01M 10/482* (2013.01)

(58) Field of Classification Search
  USPC ................. 702/60, 63, 64, 81, 183; 307/9.1; 320/132; 340/870.02
  See application file for complete search history.

(56) References Cited

U.S. PATENT DOCUMENTS

| | | | | |
|---|---|---|---|---|
| 6,462,511 | B1* | 10/2002 | Kwok | H02J 7/0024 320/119 |
| 7,577,538 | B2* | 8/2009 | Wang | G06K 9/0057 250/281 |
| 2004/0135544 | A1* | 7/2004 | King | B60L 11/185 320/116 |
| 2004/0135545 | A1 | 7/2004 | Fowler et al. | |
| 2004/0135546 | A1 | 7/2004 | Chertok et al. | |
| 2005/0073315 | A1* | 4/2005 | Murakami | G01R 31/3842 324/433 |
| 2005/0140335 | A1* | 6/2005 | Lee | H02J 7/0018 320/118 |
| 2006/0202857 | A1* | 9/2006 | Kawahara | G01R 31/3624 340/870.02 |
| 2007/0262750 | A1 | 11/2007 | Yun et al. | |
| 2008/0065336 | A1* | 3/2008 | Seo | G01R 19/16542 702/63 |
| 2008/0074082 | A1* | 3/2008 | Tae | B60L 11/1862 320/136 |
| 2008/0191663 | A1 | 8/2008 | Fowler et al. | |
| 2010/0045240 | A1* | 2/2010 | Bergveld | G01R 31/3651 320/132 |
| 2010/0085009 | A1 | 4/2010 | Kang et al. | |
| 2010/0244781 | A1* | 9/2010 | Kramer | H02J 7/0016 320/162 |
| 2010/0283430 | A1* | 11/2010 | Chaturvedi | H01M 10/441 320/134 |
| 2011/0234164 | A1* | 9/2011 | Furukawa | H02J 7/0018 320/118 |
| 2013/0002016 | A1* | 1/2013 | Furukawa | H01M 10/425 307/9.1 |
| 2013/0009605 | A1* | 1/2013 | Hongo | H01M 4/505 320/134 |
| 2013/0158914 | A1* | 6/2013 | Chen | G01R 31/3624 702/63 |

OTHER PUBLICATIONS

M. Brandl, et al., "Batteries and Battery Management Systems for Electric Vehicles" Design, Automation & Test in Europe Conference & Exhibition, XP032320886, Mar. 2012, 6 pages.

* cited by examiner

SYSTEM AND CORRESPONDING METHOD FOR ESTIMATING THE CHARGE STATUS OF A BATTERY

The invention principally relates to systems for measuring and estimating the state of charge of a battery, particularly a battery of a motor vehicle, e.g. electrically driven.

BACKGROUND

It is known from the prior art to determine the state of charge of a battery by means of sensors of current whereof the measured intensity is integrated for determining the remaining charge for each cell. This method of measurement lacks accuracy in particular owing to measurement drift and bias after long periods of measurement. Moreover, the question also arises of initializing the integration and the accuracy of the sensor.

It is known from the prior art to determine the state of charge of a battery by means of voltage sensors which measure the voltage at the terminals of a battery cell. Indeed, when the cell does not deliver any current, this voltage measurement can be used to estimate an open circuit voltage from which the state of charge can be determined. This method is disrupted when a current flows through the battery.

It is also known from the prior art to determine the state of charge of a battery using current and voltage measurements. In this case, estimation by integration is corrected by the voltage measurements when the battery does not deliver any current, e.g. when the vehicle stops.

It is also possible to estimate the state of charge using models of cell behavior via dedicated estimation tools such as Kalman filtering, for example. These methods have the disadvantage of being complex and costly.

The determination of a state of charge from a measured or predicted open circuit voltage is known from patent application EP1384086. One drawback of this solution is that it requires the use of the battery to be interrupted, during discharging or during charging, in order to measure the voltage at the terminals thereof in open circuit.

BRIEF SUMMARY

In the light of the foregoing, one object of the invention is to provide a system and a corresponding method for estimating the state of charge of a battery that addresses at least in part the abovementioned drawbacks.

The subject matter of the invention is therefore a system for estimating the state of charge of a battery comprising at least two modules each provided with at least one cell, said system including a sensor of the series current flowing through all the cells of the modules connected in series.

According to a general feature, this system further includes:
switching means capable of selectively disconnecting one of the modules, the other modules remaining connected in series; and
a calculation means configured for calculating the state of charge of the cells through which said series current flows from the integration of the series current and for calculating the state of charge of each of the cells of the disconnected module from the open circuit voltage thereof.

Thus, the state of charge can be determined using the estimated or measured open circuit voltage of the cells of the disconnected module. This determination can be used to correct the measurement of the state of charge using the current sensor for eliminating drift, which is critical particularly after long periods of measurement. According to the invention, this determination can be performed without interrupting the operation of the battery, the other modules remaining connected in series.

The state of charge can therefore be determined whenever a module is disconnected without waiting for a particular event. The disconnection of modules will be managed according to the needs of the consumers on the battery, but it is in most cases possible to operate with at least one module disconnected. One example of a situation for which all the modules must be reconnected is the case where the powertrain needs the maximum battery power, since it is then necessary to deliver the maximum voltage at the battery output. However, this situation is limited in frequency and duration. Thus the estimate of the state of charge obtained using the current sensor can be fairly frequently corrected, leading to a more accurate estimate of the state of charge.

According to one feature, the system further includes voltage sensors at the terminals of each of the cells of the disconnected module and the calculation means is configured for calculating the open circuit voltage of each of the cells of the disconnected module from the voltage at the cell terminals.

It is thus intended to calculate the open circuit voltage of the cells of the disconnected module using the voltage at the terminals thereof (measured once the module is disconnected, without necessarily waiting for a long period of relaxation), which enables this calculation to be performed faster.

According to a first embodiment, the calculation means includes estimating means configured for estimating, for each of the cells of the disconnected module, the open circuit voltage from the voltage at the cell terminals, said estimating means including:
recording means for storing in memory the value of a coefficient obtained by cell characterization tests; and
adding means configured for adding the voltage at the cell terminals at the time that the module is disconnected with the result of the multiplication between said coefficient and the difference between the voltage at the cell terminals a short time after the module is disconnected and the voltage at the cell terminals at the time that the module is disconnected.

Thus, the open circuit voltage of the cell is calculated very quickly without having to wait for the relaxation of the cell from disconnecting. This both increases the availability of the disconnected module and increases the frequency of correction and therefore the accuracy of the measurement.

According to a second embodiment, the calculation means includes estimating means configured for estimating, for each of the cells of the disconnected module, the open circuit voltage from the voltages at the cell terminals, said estimating means including:
means for determining a law governing the drop in polarization of the cell, from the evolution in voltage at the cell terminals for a certain duration counting from the disconnection of the module; and
means for calculating the value toward which said law converges.

Thus a fast determination of the open circuit voltage is also provided. The use of a law for the drop in polarization of the cell additionally means that prior characterization is not required. Thus, a robust measurement is obtained that can adapt to changes, in particular to the wear of a cell. However, this second embodiment has the drawback of requiring a longer period of relaxation (of the order of 5 minutes) for determining the law governing the drop in polarization of the cell. Determining this law is not, however, necessary at each switch of a module: updating the parameters of this evolution law may be much less frequent than module disconnections. Thus, the parameters of the law may be updated monthly and several module disconnections may be made at each charging/discharging cycle of the battery pack.

According to another embodiment, the switching means are controlled by a control means, the switching means being controlled by the control means so that each of the modules is regularly disconnected.

By regularly disconnecting each of the modules, it is possible to regularly correct the estimate of the state of charge by integrating the series current of each of the modules. Thus a more accurate estimate is obtained of the state of charge of the battery.

According to yet another embodiment, the switching means include for each of the battery modules a series switch connected to the input of the corresponding module and parallel switches connected in parallel with each of the series switches and the corresponding module.

The switching means include only two switches per module and are simple to control.

According to another feature, at least one module includes a balancing means configured for adding a balancing current to the current flowing through the cells of said module.

The balancing means can, by delivering such a current, balance the states of charge of the cells forming each of the modules.

According to another aspect, a method is provided for estimating the state of charge of a battery comprising at least two modules each provided with at least one cell.

According to a general feature, this method further includes:
- a step of selective disconnection of a module, the other modules remaining connected in series and a series current flowing through the cells of same;
- determining steps performed successively including, for each of the battery cells:
  - an integration of the series current flowing through the cell, with the initial condition thereof being the last determined state of charge of the cell, if the cell belongs to a module connected in series; or
  - a step for determining the state of charge of the cell from the open circuit voltage of the cell, if the cell belongs to a disconnected module.

Determining the state of charge using the open circuit voltage estimated or measured from a cell of a disconnected module enables a more accurate determination than the measurement by integration of the series current. Thus, the drift of the measurement by integration can be corrected. Moreover, given that only one module is disconnected, the other modules operate and can deliver a current e.g. to the electric propulsion engine of the motor vehicle containing the battery.

According to one implementation, the step for determining the state of charge of the cell from the open circuit voltage of the cell, if the cell belongs to a disconnected module, includes:
- a determination of the duration of disconnection;
- an estimation of the open circuit voltage of the cell from the measurement of the voltage at the cell terminals and a determination of the state of charge from said estimated open circuit voltage, if the duration of disconnection is equal to a certain duration; or
- copying the last estimated state of charge of the cell, if the duration of disconnection is less than or greater than said certain duration.

Thus, sufficient time is allowed after disconnection for being able to extrapolate the open circuit voltage of the cell from the voltage at the cell terminals. This estimate of the open circuit voltage obtained by extrapolation provides an accurate adjustment of the state of charge estimates.

According to another implementation, the method further includes a stopping step which includes storage of the last state of charge values determined for each of the cells.

BRIEF DESCRIPTION OF THE DRAWINGS

Other objects, features and advantages will appear on reading the following description, given solely by way of a non-restrictive example, and referring to the attached drawings, in which:

FIG. 1 illustrates a battery including four modules or battery units 1, 2, 3 and 4, switching means 37 to 44, a current sensor 45 and a control and calculation unit 46.

DETAILED DESCRIPTION

Figure 1:
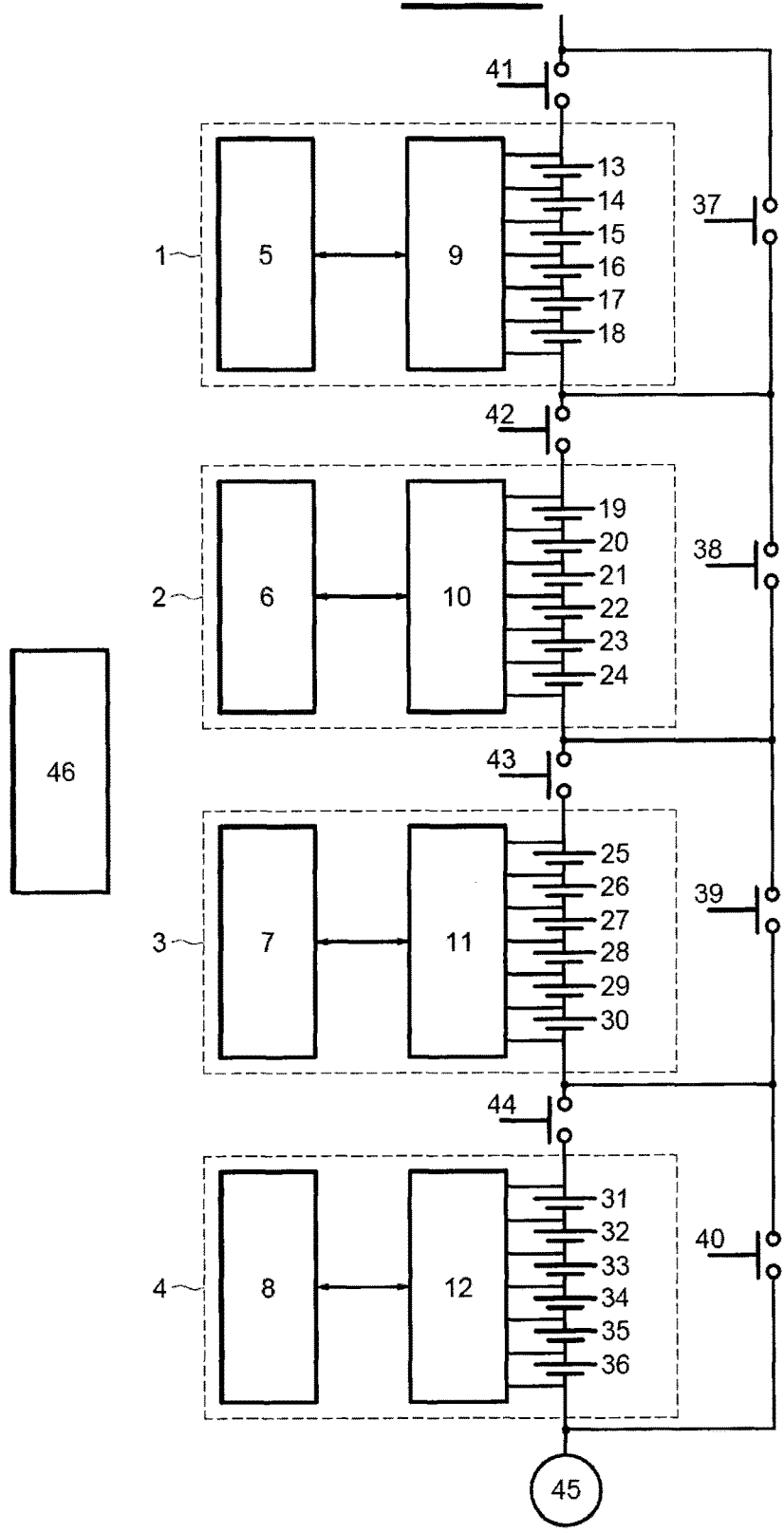
FIG. 1 illustrates a block diagram of a system for estimating the charge of a battery according to one embodiment of the invention.

Each of the modules 1, 2, 3 and 4 includes 6 cells: 13, 14, 15, 16, 17, 18 for module 1; 19, 20, 21, 22, 23, 24 for module 2; 25, 26, 27, 28, 29, 30 for module 3; and 31, 32, 33, 34, 35, 36 for module 4.

Each of the modules 1, 2, 3 and 4 also includes an integrated circuit for measuring the voltage at the terminals of each of the cells of the module thereof: the integrated circuit 9 for module 1 and for measuring the voltage at the terminals of cells 13, 14, 15, 16, 17, 18; the integrated circuit 10 for module 2 and for measuring the voltage at the terminals of cells 19, 20, 21, 22, 23, 24; the integrated circuit 11 for module 3 and for measuring the voltage at the terminals of cells 25, 26, 27, 28, 29, 30; and the integrated circuit 12 for module 4 and for measuring the voltage at the terminals of cells 31, 32, 33, 34, 35, 36.

Optionally, at least one of the modules 1, 2, 3 and 4 includes a balancing unit configured for adding a balancing current to the current flowing through the cells of the module. As an example of embodiment, module 1 includes the balancing unit 5, module 2 includes the balancing unit 6, module 3 includes the balancing unit 7 and module 4 includes the balancing unit 8. Each of these balancing units delivers a balancing current flowing through one or more cells, so as to balance the states of charge of the cells forming the module.

The switching means include series switches 41, 42, 43 and 44 connected respectively to the input of each of the modules 1, 2, 3 and 4. The switching means also include parallel switches 37, 38, 39 and 40 connected respectively in parallel with each of the module and input switch pairs (1, 41), (2, 42), (3, 43) and (4, 44).

The control and calculation unit 46 controls the switching means so that one of the modules 1, 2, 3 or 4 is disconnected and a series current flows through the remaining modules. It also controls the balancing units, by controlling any possible balancing currents flowing through one or more cells of the module. Advantageously, the unit 46 controls the switching means so that each of the modules 1, 2, 3 and 4 are regularly disconnected.

For example, in the case of the disconnection of module 2, the series switch 42 of module 2 is open (OFF according to a term well known to the person skilled in the art) and the parallel switch 38 of module 2 is closed (ON according to a term well known to the person skilled in the art) and the parallel switches 37, 39 and 40 of the remaining modules are open (OFF) and the series switches 41, 43, 44 of the remaining modules are closed (ON).

It therefore appears that the connection of each of the modules is performed by opening (OFF) the parallel switch of same and by closing (ON) the series switch thereof. The disconnection of each of the modules is performed by opening (OFF) the series switch of same and by closing (ON) the parallel switch thereof.

The control and computing unit 46 controls the integrated measurement circuits so that the voltage at the terminals of each of the cells of the disconnected module is measured.

Then the unit 46 collects the voltage measurements at the terminals of each of the cells of the disconnected module. The open circuit voltage (or OCV, according to a term well known to the person skilled in the art) of each of the cells of the disconnected module may then be deduced therefrom. However, the open circuit voltage of each of these cells is not always equal to the voltage at the terminals of each of the cells.

Figure 2:
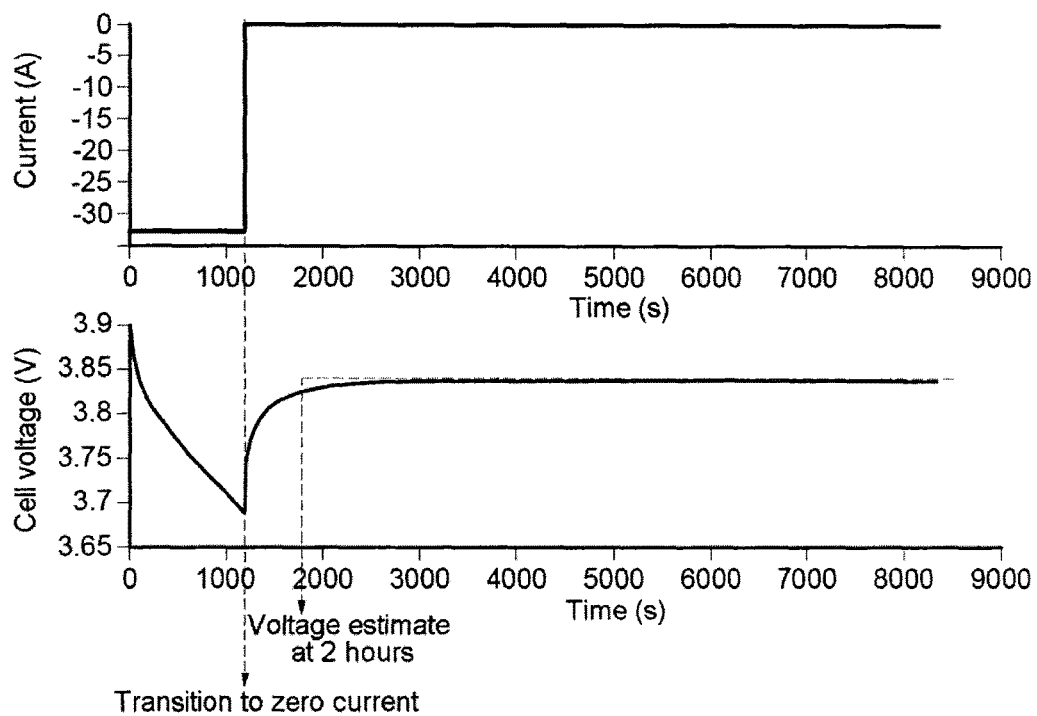
FIG. 2 illustrates the estimation of the open circuit voltage of a cell.

This phenomenon is illustrated in FIG. 2 for one cell of one of the modules, e.g. cell 21 of module 2.

FIG. 2 shows two coordinate grids each including a horizontal axis representing the time in seconds and a vertical axis representing the current in amperes flowing through the cell and the voltage in volts at the cell terminals respectively. The two curves illustrated respectively represent the evolution of the current flowing through the cell and the evolution of the voltage at the cell terminals, as a function of the time that has elapsed since the disconnection of the module.

The instant of disconnection of the module including the cell is indicated by the transition to a zero current. The value of the voltage of the cell at the time of this transition is very different from the value of the open circuit voltage illustrated in FIG. 2 by the voltage toward which the voltage at the cell terminals converges. This is due to the duration of relaxation of the cell.

According to a first embodiment, it is possible to determine the value of the open circuit voltage of the cell by a measurement of the voltage at the terminals of this cell after a sufficient duration following the disconnection of the module, e.g. 2 hours as illustrated in FIG. 2. The value obtained is, however, only an approximation of the open circuit voltage and requires waiting for two hours from disconnection. This is not advantageous since a disconnected module is a module that cannot be used e.g. for the propulsion of the vehicle.

According to another embodiment, it is proposed to use a first method of estimating the open circuit voltage.

For this method, the value of the open circuit voltage is calculated using the formula:

$$V_\infty = V_0 + \eta(V_{10} - V_0)$$

in which $V_\infty$ is the open circuit voltage to be estimated, $V_0$ is the voltage at the cell terminals at the time that the module including this cell is disconnected, $V_{10}$ is the voltage at the cell terminals a short time after disconnection of the module including this cell (e.g. 10 seconds) and $\eta$ is a coefficient that depends on the temperature, the voltage level $V_{10}$, the stress conditions prior to stopping (charging or discharging) and the wear of the cell. It is, for example, determined using tables obtained from characterization tests.

For example, the coefficient $\eta$ can be characterized for four to five temperatures in the operating range, in charging and discharging, for ten different values of voltage levels $V_{10}$, and at two wear levels of the cell. This method has the advantage that it can be used for short time intervals, allowing a greater availability of the module which includes the cells for which the open circuit voltage is estimated. This method is based on a priori knowledge of the cell, and therefore does not always enable adapting to changes.

According to yet another embodiment, it is proposed to use a second method of estimating the open circuit voltage.

This method involves estimating the law for drop in polarization or law of relaxation of the cell from voltage measurements made over a predefined time (e.g.: 5 minutes) then determining toward which balancing voltage the estimated law will converge.

In particular, the law of voltage relaxation (particularly described in the book 'Battery Management Systems Accurate State-of-Charge Indication for Battery-Powered Applications' by Valer Pop, Henk Jan Bergveld, Dmitry Danilov, Paul P. L. Regtien and Peter H. L. Notten) is defined according to the formula:

$$V(t) = V_\infty - \Gamma \frac{\gamma}{t^\alpha \log^\delta(t)} e^{\frac{\varepsilon_t}{2}},$$

with V(t) the voltage of the cell for each instant t of the relaxation phase, $V_\infty$ the open circuit voltage to be estimated, and $\Gamma$ a parameter of the model which equals 1 if the polarization is negative and −1 if the polarization is in a positive direction, $\varepsilon_t$ the model error.

According to this method, it is assumed that as soon as the current changes to zero (after charging or after discharging), polarization follows this law. It remains therefore to define an algorithm for estimating the parameters $\alpha, \delta, \gamma$ and $V_\infty$ of this formula.

One example of an algorithm for estimating these parameters is defined below:
  step 1: several candidate solutions $V_\infty$ are selected
  step 2: the following problem of linear regression is solved for the data set V(t) observed from the transition of the current to zero (over an interval of 5 min, 0≤t≤5 min, for example) and for each of the candidate solutions $V_\infty$ $$\beta(V_\infty) = pinv(X) \cdot y(V_\infty)$$

where $$\beta(V_\infty) = \begin{bmatrix} 2\log(\gamma) \\ -2\alpha \\ -2\delta \end{bmatrix}, \quad X = \begin{bmatrix} 1 & \log(t_1) & \log\log(t_1) \\ \vdots & \vdots & \vdots \\ 1 & \log(t_N) & \log\log(t_N) \end{bmatrix},$$

$$y = \begin{bmatrix} 2 \cdot \log(V_\infty - V_{t_1}) \\ \vdots \\ 2 \cdot \log(V_\infty - V_{t_N}) \end{bmatrix}$$

and pinv (X) is the pseudo-inverse matrix of the matrix X.

step 3: the model error is determined for each of the candidate solutions $V_\infty$ according to $$\hat{V}(V_\infty) = \begin{bmatrix} \hat{V}_{t_1} \\ \vdots \\ \hat{V}_{t_N} \end{bmatrix} = \begin{bmatrix} V_\infty - e^{\frac{x_{t_1} \cdot \beta(V_\infty)}{2}} \\ \vdots \\ V_\infty - e^{\frac{x_{t_N} \cdot \beta(V_\infty)}{2}} \end{bmatrix}, \text{ and } \varepsilon(V_\infty) = \|\hat{V}(V_\infty) - V\|^2$$

step 4: the candidate solution $V_\infty$ is chosen that minimizes the error $\in(V_\infty)$.

The utility of this algorithm is that it is not necessary to know a priori the values of the terms $\alpha$, $\delta$, $\gamma$ and $V_\infty$. On the contrary, no a priori knowledge of the cell is required. This method can therefore adapt to changes. It is robust in a context where the characteristics of the cell could change due to the aging of the cell.

Whatever the embodiment, the unit 46 then determines the state of charge (or SOC, according to a term well known to the person skilled in the art) of each of the cells of the disconnected module from the estimated open circuit voltages (OCV) of each of the cells of the disconnected module.

Figure 3:
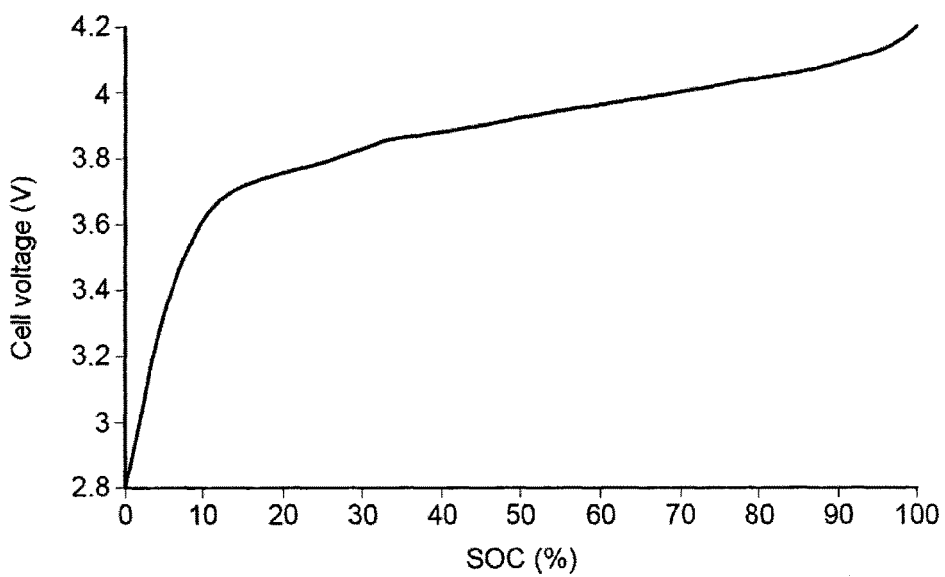
FIG. 3 shows a curve which represents the open circuit voltage of a cell according to the state of charge thereof.

This determination is illustrated in FIG. 3. FIG. 3 includes a coordinate grid with a horizontal axis representing the state of charge (SOC) as a percentage and a vertical axis representing the open circuit voltage of the cell in volts. The illustrated curve represents the value of the state of charge as a function of the open circuit voltage. It is then possible to use this curve to determine the state of charge as a function of an estimated open circuit voltage.

The illustrated curve is one example. It actually depends in particular on the chemical composition of the cell and the temperature. This curve is, for example, determined empirically during a characterization of the cells in different temperature ranges.

The control and calculation unit 46 may, according to one embodiment, store for each of the cells and a plurality of temperature ranges these curves which enable it to determine the state of charge of each of the cells from the open circuit voltage (OCV).

In parallel with the processing described above for the disconnected module, the control and calculation unit 46 also collects the measurement of the series current carried out by the sensor 45.

The unit 46 then determines the state of charge of each of the cells of the connected modules from the series current. This determination includes an integration of the series current.

As an example of embodiment, the following iterative formula may be used:

$$\forall i \in \|1, 6\|, SoC_{b,i}(k) = SoC_{b,i}(k-1) + \frac{I_c(k) \cdot T_e}{Q_{maxb,i}}$$

in which b corresponds to a connected unit number, i corresponds to a cell number of the connected unit b, k corresponds to a sampling interval, $I_c(k)$ is the series current measured by the sensor 45 at sampling interval k, $T_e$ is the sampling period of the current signal also corresponding to the duration between two sampling intervals, $SoC_{b,i}(k)$ corresponds to the state of charge of cell i of the connected module b at sampling interval k and $SoC_{b,i}(k-1)$ corresponds to the state of charge of cell i of the connected module b at sampling interval k−1 and $Q_{max\ b,i}$ is the maximum charge of cell i of the connected module number b.

Furthermore, in the case where module b comprising cell i includes a balancing unit (5, 6, 7, 8) it is advantageous to add to the series current $I_c(k)$ the current delivered by the balancing unit of module b for calculating the state of charge of said cell according to the above formula.

Figure 4:
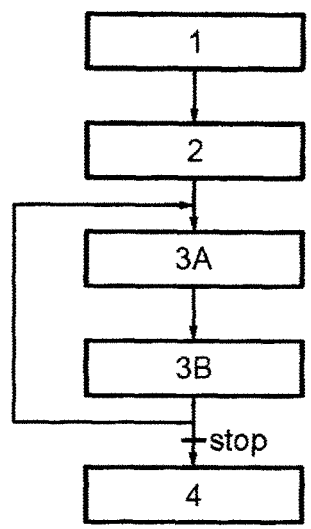
FIGS. 4 and 5 illustrate a block diagram of a method for estimating the charge of a battery according to one implementation of the invention.

FIG. 4 illustrates an implementation of a method for determining the state of charge of a battery according to the invention. This method is performed by the control and calculation block 46. It includes four steps.

During a first initialization step (step 1), the initial state of charge of all the cells of the battery modules is determined. Written mathematically, this corresponds to determining the values $SoC_{b,i}(1)$ with $1 \le b \le 4$ and $1 \le i \le 6$, the term $SoC_{b,i}(1)$ corresponding to the initial state of charge (hence the FIG. 1 in parentheses) for cell number i of module number b.

Step 1 includes the following sub-steps:

The duration of stopping $T_{pause}$ during which the system has remained stopped is calculated.

The duration of stopping $T_{pause}$ is compared with a defined value $T_{pause\_min}$;

If the pause was sufficiently long for relaxation to have occurred, i.e. if the duration of stopping is greater than the defined value ($T_{pause} \ge T_{pause\_min}$), it is assumed that the voltage at the cell terminals corresponds to the open circuit voltage.

Then the initial state of charge of each cell is determined using an empirical curve such as that illustrated in FIG. 3 representing the unique relationship between the open circuit voltage and the state of charge, for a given temperature. I.e. in mathematical terms:

$\forall b \in \|1,4\|, \forall i \in \lambda 1, 6\|, SoC_{b,i}(1) = f(OCV_{b,i}(1), \text{temperature}_{b,i}(1))$ in which $SoC_{b,i}(1)$ corresponds to the initial state of charge for cell number i of module number b, $OCV_{b,i}(1)$ corresponds to the initial open circuit voltage (hence the FIG. 1 in parentheses) for cell number i of module number b, temperature$_{b,i}(1)$ corresponds to the temperature of cell number i of module number b, and f( ) is a function whereof the curve is shown in FIG. 3 and which is used to determine the state of charge as a function of the open circuit voltage.

If the pause was not sufficiently long ($T_{pause} < T_{pause\_min}$), the initial state of charge of each cell is determined by copying the last estimated value, stored during a stopping step (described below). I.e. in mathematical terms:

$\forall b \in \|1,4\|, \forall i \in \|1,6\|, SoC_{b,i}(1) = SoC_{b,i\_stored}$ in which $SoC_{b,i}(1)$ corresponds to the initial state of charge (hence the number 1 in parentheses) for cell number i of module number b and $SoC_{b,i\_stored}$ corresponds to the last estimated value, stored during the stopping step, of the state of charge of cell number i of module number b.

The method also includes a second step (step 2 in FIG. 4) for determining the initial state of charge of the battery from the initial states of charge of each of the battery cells. For example, the formula below can be used:

$$SoC_{pack}(1) = \min_{1 \le b \le 4, 1 \le i \le 6}(SoC_{b,i}(1))$$

in which $SoC_{pack}(1)$ corresponds to the initial state of charge of the battery and the function $$\min_{1\le b\le 4, 1\le i\le 6}(\ )$$

is used to determine the minimum initial state of charge of all the battery cells.

The process continues via a step 3A of selective disconnection of one of the modules. This step 3A is performed using the switching means and the unit 46 illustrated in FIG. 1. This step 3A is performed successively for disconnecting each of the b modules, for configurable durations (e.g. 5 seconds).

Figure 5:
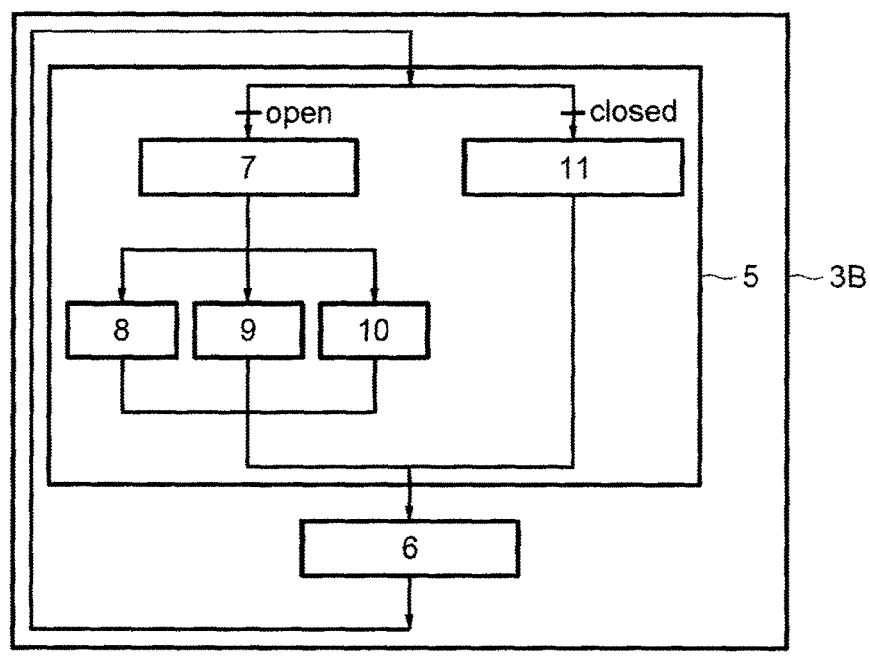

The method further includes a step 3B for determining the state of charge of each of the cells over time. For each of the b modules, the way of estimating the states of charge of the cells forming same depends on the state of the switching means associated with the module. One example of embodiment of this step 3B is described later (FIG. 5).

The method may include a stopping step 4. This step is, for example, triggered by a vehicle stopping or any event justifying the unit 46 stopping.

Step 4 includes writing the last determined states of charge of each of the cells to memory. I.e. in mathematical terms:

$$\forall b \in \|1,4\|, \forall i \in \|1,6\|, SoC_{b,i\_stored}=SoC_{b,i}(k)$$

in which $SoC_{b,i}(k)$ corresponds to the state of charge at the last sampling interval k (hence the figure k in parentheses) for cell number i of module number b and $SoC_{b,i\_stored}$ corresponds to the value of the state of charge which is stored during the stopping step for cell number i of module number b.

FIG. 5 illustrates an example of an implementation of step 3B.

This step includes a step 5 and a step 6 which are performed successively for each of the sampling intervals.

Step 5 is further repeated for each of the b modules of the battery ($1 \le b \le 4$).

Step 5 is subdivided into two branches, each of the branches being implemented according to the state (connected or disconnected) of the module b considered.

The first branch includes steps 7, 8, 9, 10. It corresponds to the case of a disconnected module, i.e. a module whereof the series switch at the input is open.

Step 7 is a step for determining the duration of disconnection of the module.

Step 7 is, for example, performed using an incrementation of the duration of opening $T_{CS}$ of the series switch of the module including the cell considered.

Then, the first branch continues following steps 8, 9 and 10 which are performed according to the duration of opening $T_{CS}$.

If the duration of opening has not been sufficiently long ($T_{CS} < T_{minimum\_opening}$), step 8 is performed. According to this step, the state of charge of each cell of module b considered is maintained at the value of the previous time interval. Indeed, there is no current flowing in the cell. In mathematical terms:

$$\forall i \in \|1,6\|, SoC_{b,i}(k) = SoC_{b,i}(k-1)$$

in which $SoC_{b,i}(k)$ corresponds to the state of charge of cell i of the disconnected module b at sampling interval k and $SoC_{b,i}(k-1)$ corresponds to the state of charge of cell i of the disconnected module b at sampling step k−1.

If the opening time interval has been sufficiently long ($T_{CS}=T_{minimum\_opening}$), step 9 is performed.

According to step 9, the relaxation voltage of each cell of the module b considered is estimated using, for example, one of the methods mentioned above (first method using the voltage at the cell terminals for a short time after the disconnection of the module or second method using the law for the drop in polarization). It is thus possible to obtain $V_{\infty_{b,i}}(k)$, $\forall i \in \|1,6\|$, in which $V_{\infty_{b,i}}(k)$ is the open circuit voltage for sampling interval k of cell i belonging to the module b considered.

The state of charge of each cell of the module is then calculated directly from the relationship:

$$\forall i \in \|1,6\|, SoC_{b,i}(k) = f(V_{\infty_{b,i}}(k), temperature_{b,i}(k)),$$

in which f( ) is a function whose curve is, for example, illustrated in FIG. 3 and which is used to determine the state of charge according to the open circuit voltage, $SoC_{b,i}(k)$ corresponds to the state of charge at sampling interval k (hence the figure k in parentheses) for cell i of the disconnected module b, and $V_{\infty_{b,i}}(k)$ is the open circuit voltage for sampling interval k of cell i belonging to the disconnected module b.

This step 9 therefore corresponds, for each cell of the module b considered, to an estimate of the open circuit voltage of the cell from the voltage at the cell terminals and a determination of the state of charge from said estimated open circuit voltage. It is performed if the duration of disconnection is equal to a certain duration.

If the duration of opening is greater than the minimum duration ($T_{CS} > T_{minimum\_opening}$), step 10 is performed. According to this step, the state of charge of each cell is maintained at the value of the previous interval. In mathematical terms:

$$\forall i \in \|1,6\|, SoC_{b,i}(k) = SoC_{b,i}(k-1)$$

in which $SoC_{b,i}(k)$ corresponds to the state of charge of cell i of the disconnected module b at sampling interval k and $SoC_{b,i}(k-1)$ corresponds to the state of charge of cell i of the disconnected module b at sampling step k−1.

Thus, step 8 amounts to preserving the value of the SOC estimated at instant k−1 $SoC_{b,i}(k-1)$ (obtained by integration of the current) until the duration of disconnection has been sufficient.

Step 10 consists in preserving the value of the SOC obtained $SoC_{b,i}(k-1)$ by estimating the voltage after relaxation, until the module is reconnected.

The second branch includes step 11 which corresponds to the case of a connected module, i.e. a module whereof the series switch at the input is closed.

Step 11 is a step for determining the state of charge of each of the cells of the module b considered. The same series current determined by the sensor 45 flows through these cells. The state of charge of each of these cells is calculated by integrating the series current measurement:

$$\forall i \in \|1,6\|, SoC_{b,i}(k) = SoC_{b,i}(k-1) + \frac{I_c(k) \cdot T_e}{Q_{max b,i}}$$

in which $T_e$ is the sampling period of the current signal also corresponding to the duration between two sampling intervals, $I_c(k)$ is the series current measured by the sensor 45 at sampling interval k, $SoC_{b,i}(k)$ corresponds to the state of charge of cell i of the connected module b at sampling interval k and $SoC_{b,i}(k-1)$ corresponds to the state of charge of cell i of the connected module b at sampling interval k−1 and $Q_{max\ b,i}$ is the maximum charge of cell i of the connected module b. In the case where the module b considered includes a balancing unit, it is advantageous to add to the series current $I_c(k)$ the current delivered by the balancing unit to each of the cells forming module b, for calculating the state of charge of these cells according to the above formula.

Step 6 is a step for determining the state of charge of the battery at sampling interval k from the states of charge of all the cells of the battery at sampling interval k. One example of a usable formula for step 6 is:

$$SoC_{pack}(k) = \min_{1 \leq b \leq 4, 1 \leq i \leq 6} (SoC_{b,i}(k)),$$

in which $SoC_{pack}(k)$ corresponds to the state of charge at sampling interval k of the battery and the function $$\min_{1 \leq b \leq 4, 1 \leq i \leq 6} (\ )$$

is used to determine the minimum state of charge of all the battery cells at sampling interval k.

The system and the corresponding method described according to the invention enable a simple device to obtain an accurate estimate of the state of charge of a battery including at least two modules, each of the two modules having at least one cell. This accuracy is achieved thanks to determining the state of charge using a determination of the open circuit voltage, which is, for example, performed regularly on each of the modules. This determination of the open circuit voltage can be performed without interruption of the battery (the other modules remaining connected in series) and can therefore be relatively frequent.

The invention claimed is:

1. A system for estimating a state of charge associated with a battery of a motor vehicle, the battery comprising at least two modules each provided with at least one cell, and said system comprising:
    a sensor configured to sense a series current flowing through all cells of the modules, the modules being connected in series;
    switching circuitry configured to selectively disconnect only one of the modules from the other module or modules, the other module or modules remaining connected in series, the selective disconnecting of the modules being according to a regular cycle in which the modules are selectively disconnected in sequence; and
    processing circuitry configured to perform the following operations in parallel:
        calculate a state of charge of the cells through which said series current flows from integration of said series current, and
        calculate a state of charge of each of the cells of the only one disconnected module from an open circuit voltage thereof,
    wherein the processing circuitry is further configured to correct the calculated state of charge of the cells through which said series current flows using the calculated state of charge of each of the cells of the only one disconnected module when the motor vehicle is moving and without interrupting operation of the battery.

2. The estimating system as claimed in claim 1, further comprising:
    voltage sensors at terminals of each of the cells of the disconnected module,
    wherein the processing circuitry is configured to calculate the open circuit voltage of each of the cells of the disconnected module from the voltage at the cell terminals.

3. The estimating system as claimed in claim 2, wherein the processing circuitry is configured to estimate, for each of the cells of the disconnected module, the open circuit voltage from the voltage at the cell terminals, the estimating by the processing circuitry including:
    storing in memory a value of a coefficient obtained by cell characterization tests; and
    adding the voltage at the cell terminals at a time that the module is disconnected with a result of multiplication between the coefficient and a difference between the voltage at the cell terminals a predetermined time after the module is disconnected and the voltage at the cell terminals at the time that the module is disconnected.

4. The estimating system as claimed in claim 2, wherein the processing circuitry is configured to estimate, for each of the cells of the disconnected module, the open circuit voltage from the voltage at the cell terminals, the estimating by the processing circuitry including:
    determining a predetermined law governing a drop in polarization of the cell, from the evolution in voltage at the cell terminals for a certain duration counting from the disconnection of the module; and
    calculating a value toward which said predetermined law converges.

5. The system as claimed in claim 1, wherein the switching circuitry is controlled by a controller, the switching circuitry being controlled by the controller so that each of the modules is regularly disconnected.

6. The system as claimed in claim 1, wherein the switching circuitry includes, for each of the battery modules, a series switch connected to an input of the corresponding module, and a parallel switch connected in parallel with each of the series switches and the corresponding module.

7. The system as claimed in claim 1, wherein the processing circuitry is configured to add a balancing current to the current flowing through the cells of at least one module of the at least two modules.

8. A method of estimating a state of charge associated with a battery of a motor vehicle, the battery comprising at least two modules, each provided with at least one cell, and the method comprising:
    selectively disconnecting, using switching circuitry, only one of the modules from the other module or modules, the other module or modules remaining connected in series, and a series current flowing through the cells of the other module or modules remaining connected the selective disconnecting of the modules being according to a regular cycle in which the modules are selectively disconnected in sequence;
    determining, using processing circuitry, for each of the battery cells successively:
        an addition of integration of the series current at a last determined state of charge of the cell, when the cell belongs to the module or modules connected in series, and
        a state of charge of the cell from an open circuit voltage of the cell, when the cell belongs to said only one disconnected module; and correcting, using the processing circuitry, a determined state of charge of the cells through which said series current flows using a determined state of charge of the open circuit voltage cells when the motor vehicle is moving and without interrupting operation of the battery.

9. The method as claimed in claim 8, wherein said determining the state of charge of the cell from the open circuit voltage of the cell, when the cell belongs to said only one disconnected module, includes:
   determining a duration of disconnection; and
   estimating the open circuit voltage of the cell from the voltage at the cell terminals and a determination of the state of charge from said estimated open circuit voltage, when the duration of disconnection is equal to a certain duration, or copying the last determined state of charge of the cell, when the duration of disconnection is greater than or less than said certain duration.

10. The method as claimed in claim 9, further comprising:
   stopping, after said determining the duration of disconnection, storage of the last state of charge values determined for each of the cells.

* * * * *